(12) United States Patent
Tate

(10) Patent No.: US 7,277,282 B2
(45) Date of Patent: Oct. 2, 2007

(54) INTEGRATED CIRCUIT COOLING SYSTEM INCLUDING HEAT PIPES AND EXTERNAL HEAT SINK

(75) Inventor: Alan Tate, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 325 days.

(21) Appl. No.: 11/022,903

(22) Filed: Dec. 27, 2004

(65) Prior Publication Data

US 2006/0139880 A1 Jun. 29, 2006

(51) Int. Cl.
*H05K 7/20* (2006.01)
*F28F 7/00* (2006.01)
*F28D 15/00* (2006.01)
*H01L 23/34* (2006.01)
*H01B 7/42* (2006.01)

(52) U.S. Cl. ............... 361/697; 361/703; 361/704; 361/718; 165/80.3; 165/104.21; 257/713; 174/15.2

(58) Field of Classification Search ........ 361/695–697, 361/700–704, 752, 717–719; 165/80.3, 104.13–104.34, 165/122; 257/675–678, 712–715; 174/15.1–15.2, 174/16.3, 50; 62/259.2; 312/223.2
See application file for complete search history.

(56) References Cited

U.S. PATENT DOCUMENTS

| | | | | |
|---|---|---|---|---|
| 5,285,347 A * | 2/1994 | Fox et al. | .................... | 361/699 |
| 5,339,214 A * | 8/1994 | Nelson | ........................ | 361/695 |
| 5,365,749 A * | 11/1994 | Porter | ........................ | 62/259.2 |
| 5,402,160 A * | 3/1995 | Kadowaki et al. | ............. | 347/18 |
| 5,731,954 A * | 3/1998 | Cheon | ........................ | 361/699 |
| 6,047,766 A * | 4/2000 | Van Brocklin et al. | . | 165/104.26 |
| 6,058,012 A * | 5/2000 | Cooper et al. | ............. | 361/704 |
| 6,088,223 A * | 7/2000 | Diemunsch | ................. | 361/690 |
| 6,166,907 A * | 12/2000 | Chien | ......................... | 361/699 |
| 6,234,240 B1 * | 5/2001 | Cheon | ........................ | 165/80.3 |
| 6,352,104 B1 * | 3/2002 | Mok | .......................... | 165/80.3 |
| 6,407,916 B1 * | 6/2002 | Konstad | ..................... | 361/687 |
| 6,549,414 B1 * | 4/2003 | Tokuhara et al. | ........... | 361/719 |
| 6,925,829 B2 * | 8/2005 | Wei | ............................. | 62/259.2 |
| 6,940,717 B2 * | 9/2005 | Shih-Tsung | ................. | 361/695 |
| 6,967,842 B2 * | 11/2005 | Aoki et al. | ................. | 361/701 |
| 6,968,709 B2 * | 11/2005 | Goth et al. | ................ | 62/259.2 |
| 6,979,772 B2 * | 12/2005 | Meng-Cheng et al. | .. | 174/17 VA |
| 6,989,990 B2 * | 1/2006 | Malone et al. | .............. | 361/699 |
| 6,997,247 B2 * | 2/2006 | Malone et al. | .............. | 165/150 |
| 7,002,799 B2 * | 2/2006 | Malone et al. | .............. | 361/699 |
| 7,130,193 B2 * | 10/2006 | Hirafuji et al. | ............. | 361/700 |
| 7,133,284 B2 * | 11/2006 | Lee | ............................ | 361/697 |
| 7,203,063 B2 * | 4/2007 | Bash et al. | ................. | 361/699 |
| 2004/0070949 A1* | 4/2004 | Oikawa et al. | ............. | 361/718 |
| 2004/0085733 A1* | 5/2004 | Leon et al. | ................. | 361/700 |

(Continued)

*Primary Examiner*—Anatoly Vortman
*Assistant Examiner*—Bradley H Thomas
(74) *Attorney, Agent, or Firm*—Buckley, Maschoff & Talwalker LLC

(57) ABSTRACT

An apparatus includes an integrated circuit (IC) package and a heat sink having a base and a plurality of fins extending from the base. The apparatus further includes a plurality of heat pipes. Each heat pipe has a first end and a second end. The first ends of the heat pipes are thermally coupled to the IC package, and the second ends of the heat pipes are thermally coupled to the base of the heat sink to transfer heat from the IC package to the heat sink.

14 Claims, 5 Drawing Sheets

U.S. PATENT DOCUMENTS

2004/0184236 A1* 9/2004 Lee .............................. 361/697
2004/0246677 A1* 12/2004 Chen ........................... 361/697
2005/0006085 A1* 1/2005 Nelson ........................ 165/299
2005/0243514 A1* 11/2005 Malone et al. ............... 361/697
2005/0257532 A1* 11/2005 Ikeda et al. ................... 62/3.7
2005/0286229 A1* 12/2005 Ku .............................. 361/709

* cited by examiner

INTEGRATED CIRCUIT COOLING SYSTEM INCLUDING HEAT PIPES AND EXTERNAL HEAT SINK

BACKGROUND

As the technology of integrated circuits (ICs) and particularly microprocessors has advanced, there has been a tendency for the devices to dissipate increased power. Thus cooling requirements for ICs have increased. In a typical desktop personal computer, a fan is provided in the computer housing to blow air at a heat sink that is thermally coupled directly on the microprocessor package. One disadvantage of such a system is the acoustic noise that may be produced by the fan. Although fan noise may be acceptable in an office environment, or in a home office, fan noise from the computer housing may prove to be an impediment to proposals to introduce so-called "entertainment PCs" intended for the home theater, living room, family room, etc.

DETAILED DESCRIPTION

Figure 1:
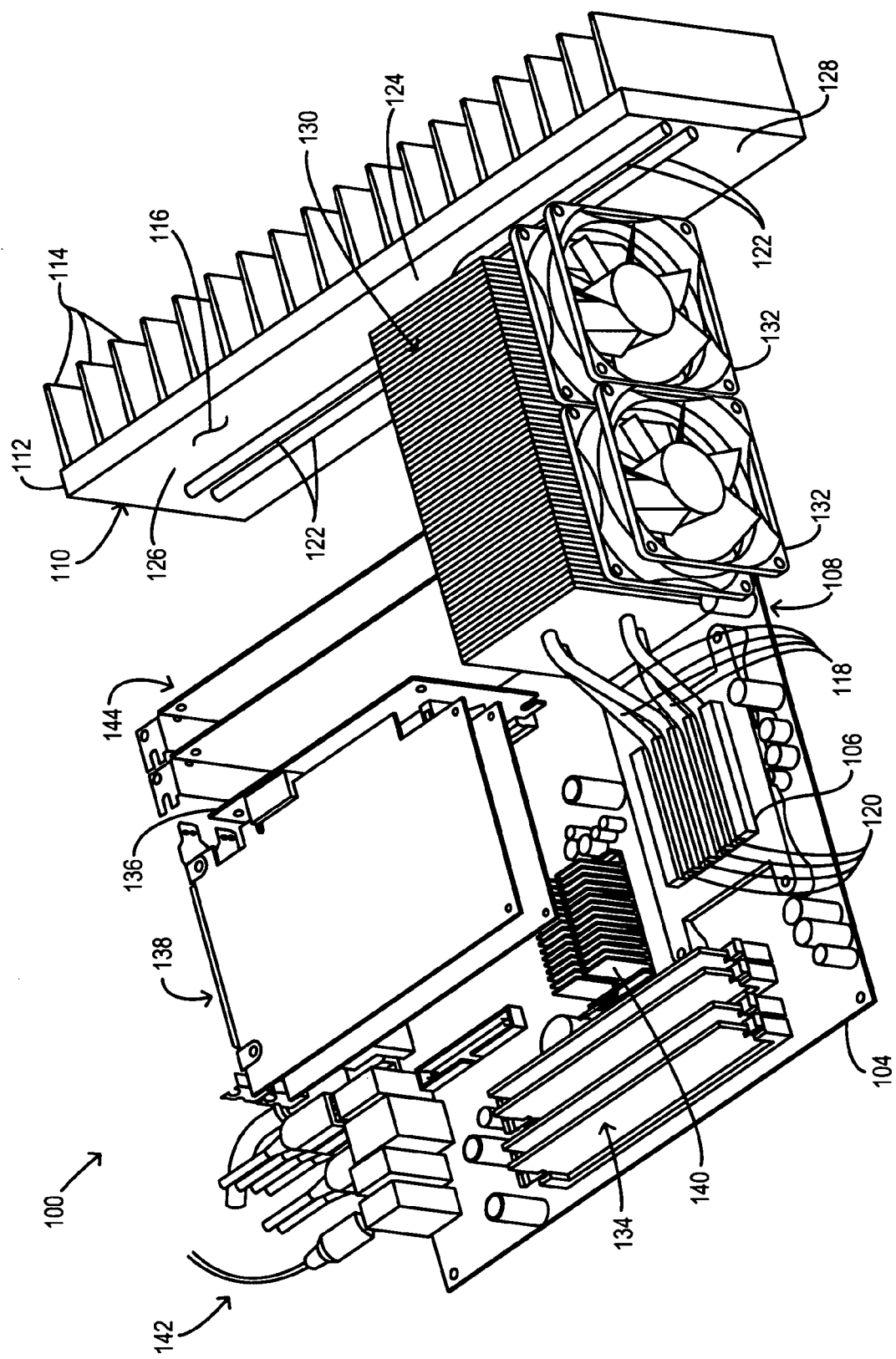
FIG. 1 is a somewhat schematic, partial isometric view of a computer system provided according to some embodiments.
Figure 2:
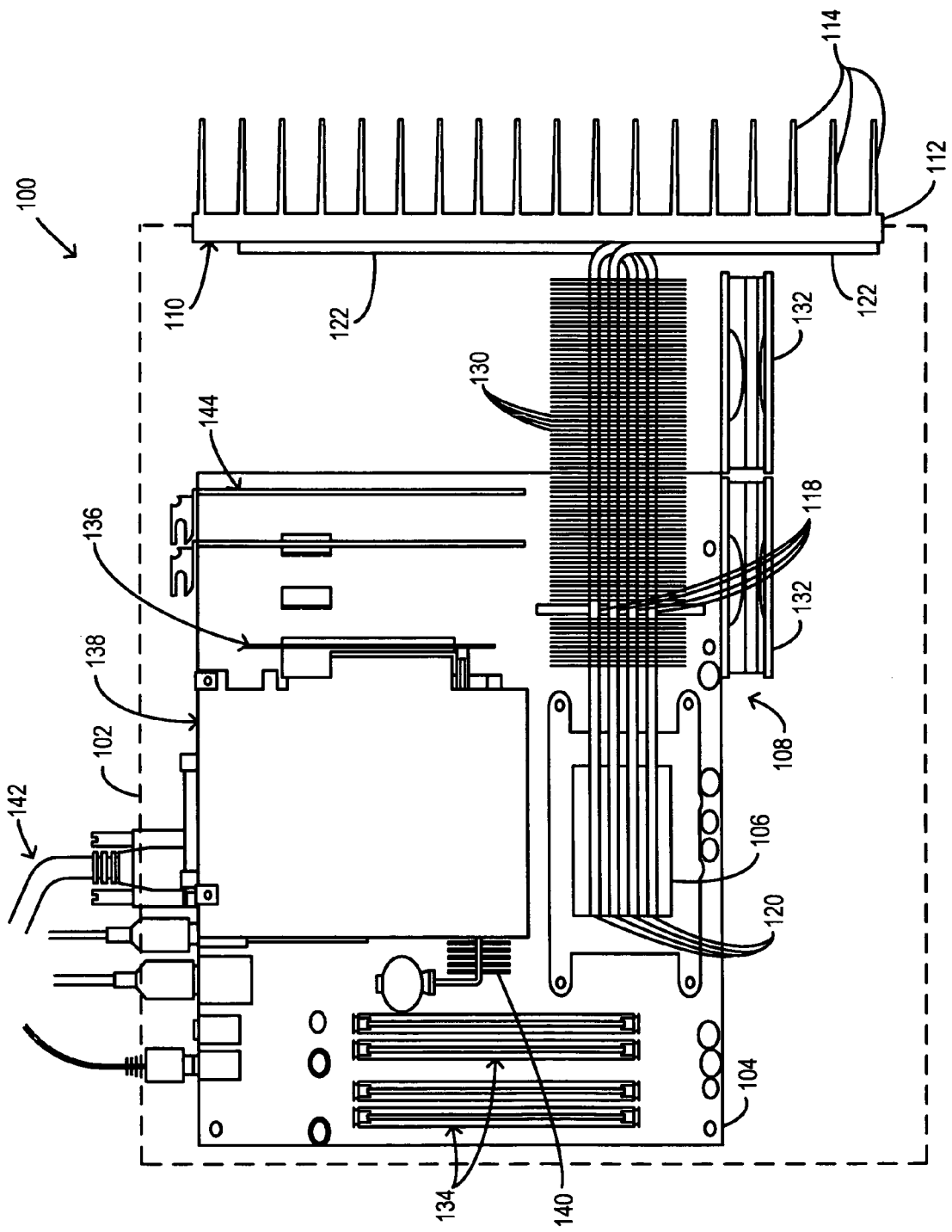
FIG. 2 is a somewhat schematic, partial plan view of the computer system of FIG. 1.
Figure 3:
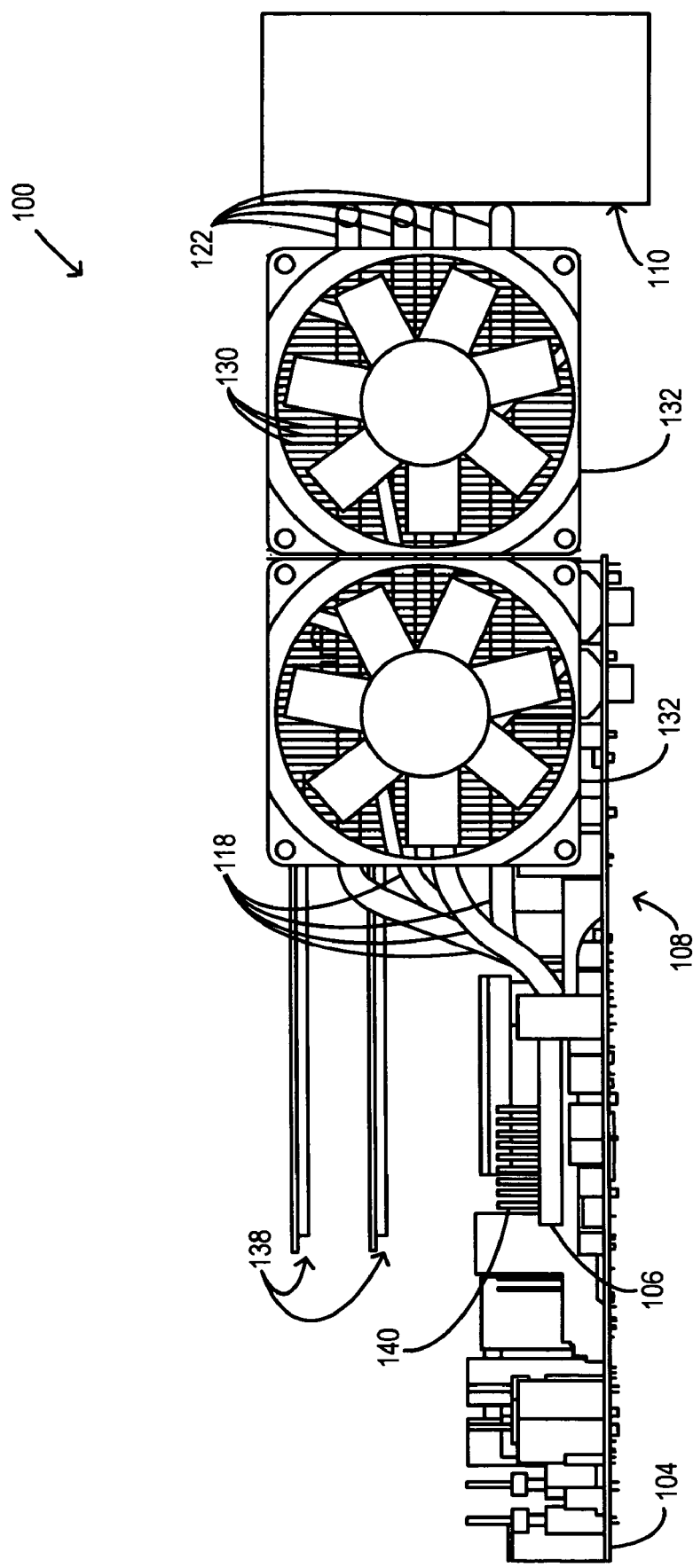
FIG. 3 is a somewhat schematic, partial side view of the computer system of FIGS. 1 and 2.

FIG. 1 is a somewhat schematic, partial isometric view of a computer system 100 provided according to some embodiments. FIG. 2 is a somewhat schematic, partial plan view of the computer system 100, and FIG. 3 is a somewhat schematic, partial side view of the computer system 100.

The computer system 100 includes a housing which is generally indicated in phantom (reference numeral 102) in FIG. 2, but which for the most part is not otherwise shown in the drawings. The computer system 100 also includes a motherboard 104 that is mounted inside the housing 102.

In addition, the computer system 100 includes a microprocessor package 106 which is mounted on the motherboard 104 and thus is contained within the housing 102. It will be appreciated that the microprocessor package 106 is a particular type of IC package, i.e., an IC package that includes a microprocessor die (not separately shown).

The computer system 100 further includes a cooling system 108 for dissipating heat generated by operation of the microprocessor. The cooling system 108 includes a heat sink 110. The heat sink 110 is mounted as part of the housing 102 (see FIG. 2). In some embodiments the heat sink may be formed as a unitary body such as an extruded copper or aluminum body. The heat sink 110 includes a base 112 and a plurality of fins 114 that extend perpendicularly (and thus parallel to each other) from the base 112. The base 112 of the heat sink 110 may be substantially in the form of a rectangular prism. The fins 114 may be rectangular in profile and may taper so as to be reduced in thickness away from base 112. The fins 114 extend exteriorly (FIG. 2) from the housing 102 and thus are in the ambient air outside of the housing. The heat sink 110, and particularly its base 112, also has a surface 116 (FIG. 1), which may be referred to as an "inner surface" in that the surface 116 of the heat sink 110 effectively forms part of the inner surface of the housing 102 and thus is at the interior of the housing 102.

The heat sink 110 may be dimensioned so that it is rather large and thus can dissipate a large amount of heat. For example, in some embodiments the base 112 of the heat sink 110 may have a length of about 15 inches, a height of 3.5 to 4 inches and a thickness of about 1.5 inches. The fins 114 may have the same height as the base 112, i.e., 3.5 to 4 inches, and may extend out from the base 112 to a length of about 1.5 inches. The fins 114 may have a thickness at the base 112 of about 100 thousands of an inch and may taper to a thickness of about 50 thousands of an inch near their tips. Each fin 114 may be spaced at a center-to-center distance of about one inch from its neighboring fins. The fins 114 may be formed at regular intervals all along the length of the base 112.

In other embodiments, the heat sink 110 may have a different shape and/or different dimensions from those just described.

The cooling system 108 also includes a number of heat pipes 118. In the particular embodiment illustrated there are four heat pipes 118, though the number may be more or fewer than four. Each heat pipe 118 has a proximal end 120 (FIGS. 1 and 2) that is thermally coupled to the microprocessor package 106. Each heat pipe 118 also has a distal end 122 that is thermally coupled to the surface 116 of the base 112 of the heat sink 110.

In some embodiments, the distal ends 122 of the heat pipes 118 may be thermally coupled to the surface 116 of the base 112 of the heat sink 110 by thermal grease which is not shown. The distal ends 122 of the heat pipes 118 may be mechanically secured to the surface 116 of the base 112 of the heat sink 110 by straps, which are not shown. In other embodiments, the distal ends 122 of the heat pipes 118 may be soldered to the surface 116 of the base 112 of the heat sink 110. In some embodiments, some of the distal ends 122 may run along the surface 116 of the base 112 of the heat sink 110 from a central portion 124 (FIG. 1) of the base 112 to an end 126 of the base 112, while other of the distal ends 122 may run along the surface 116 from the central portion of the base 112 to the other end 128 of the base 112.

The courses of the heat pipes 118 may be generally parallel between the microprocessor package 106 and the heat sink 110.

The heat pipes 118 may be generally conventional in terms of their internal construction. In some embodiments the heat pipes 118 may be hollow but fully enclosed copper tubes partially filled with a fluid such as water. A suitable diameter for the heat pipes may be 6 millimeters, although other diameters such as 4 or 8 millimeters may be used. The heat pipes 118 may also include a wicking structure (not shown) inside the tubes to wick condensed fluid from the cool end (distal end) of the heat pipes to the hot end (proximal end) of the heat pipes. For example, the wicking structure may be formed of sintered metal, copper strands held against the inside wall of the heat pipe by a spiral spring or the like, a metal screen and/or grooves in the inside wall of the heat pipe.

The cooling system 108 also includes a number of fins 130 mounted along the parallel courses of the heat pipes 118. Each fin may be a square or otherwise rectangular metal (e.g., copper or aluminum) plate. Each fin 130 may be rather thin (e.g., with a thickness of 0.4 mm or 0.2 mm). The fins 130 may be oriented so as to be substantially parallel to each other and may be mounted at regular intervals such as every 1 to 2 mm on the heat pipes 118 along the parallel course of the heat pipes 118. The fins 130 may be rather numerous, e.g., numbering in the dozens, and may be oriented transversely relative to the lengths of the heat pipes 118. The fins 130 may largely fill the space between the microprocessor package 106 and the heat sink 110.

The cooling system 108 also includes one or more fans 132 (e.g., two fans as shown in the drawings). The fans may be positioned side-by-side relative to each other, and may be positioned so as to selectively (i.e., when actuated) blow air between the fins 130.

Certain other components of the computer system 100 will now be identified. For example, the computer system 100 also includes memory cards 134 mounted on the motherboard 104. Also included in the computer system 100 and mounted on the motherboard 104 is a riser card 136. Mounted to the motherboard 104 via the riser card 136 are PCI Express add-in cards 138.

The computer system 100 includes a memory controller hub (MCH) chipset, which is not visible in the drawings. However, a heat sink 140 for the MCH chipset is visible and is shown mounted on the motherboard 104. In addition, the computer system 100 includes data connectors shown at 142 to allow data to be transferred to/from the motherboard 104. The computer system 100 also may include low-profile PCI add-in cards 144 mounted on the motherboard 104.

The computer system 100 may include other components which either are not shown in the drawings or are not named above. Except for the cooling system 108 and a control system for the cooling system to be described below, the computer system 100 may be, in some embodiments, entirely conventional in its design and in its constituent components and in its operation.

Figure 4:
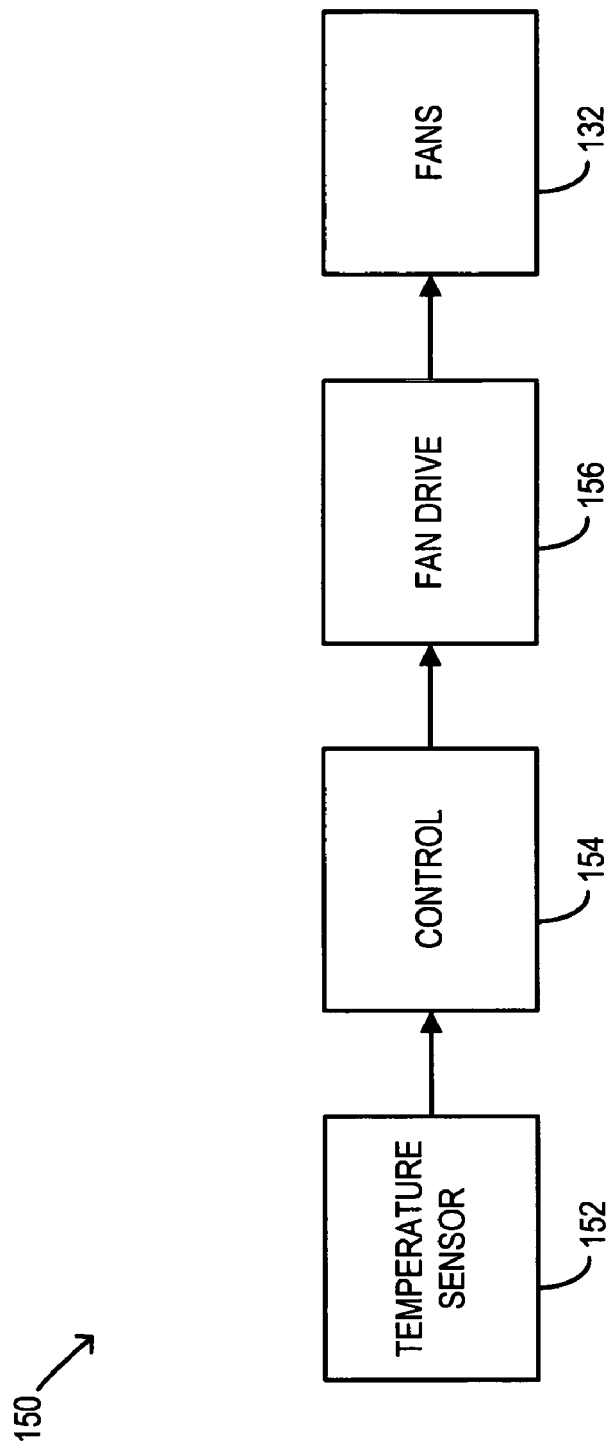
FIG. 4 is a block diagram that represents a fan control system that is part of the computer system of FIGS. 1-3.

FIG. 4 is a block diagram that represents a fan control system 150 that is part of the computer system 100. The fan control system 150 may also be considered to be part of the cooling system 108. Except for the fans 132, components of the fan control system 150 are not separately shown in FIGS. 1-3.

Referring to FIG. 4, the fan control system 150 may include one or more temperature sensors 152. For example, a thermal diode (not separately shown) may be included on-die as part of the microprocessor that is housed in the microprocessor package 106 (FIG. 1). In addition, or alternatively, another temperature sensor or sensors may be mounted on the microprocessor package 106, or on the motherboard 104 or elsewhere within the housing 102 of the computer system 100.

The fan control system 150 may also include a control circuit 154. For example, the control circuit 154 may be constituted by a controller IC (not separately shown) that may be mounted on the motherboard 104. The control circuit 154 may be coupled to the temperature sensor 152 to receive an output signal from the temperature sensor 152. A fan drive circuit 156, in turn, may be coupled to the control circuit 154, and may be controlled by the control circuit 154 to selectively provide a drive signal to the fans 132 to selectively actuate the fans 132.

Operation of the cooling system 108 will now be described, in part by reference to FIG. 5, which is a flow chart that represents a process performed by the control circuit 154.

Figure 5:
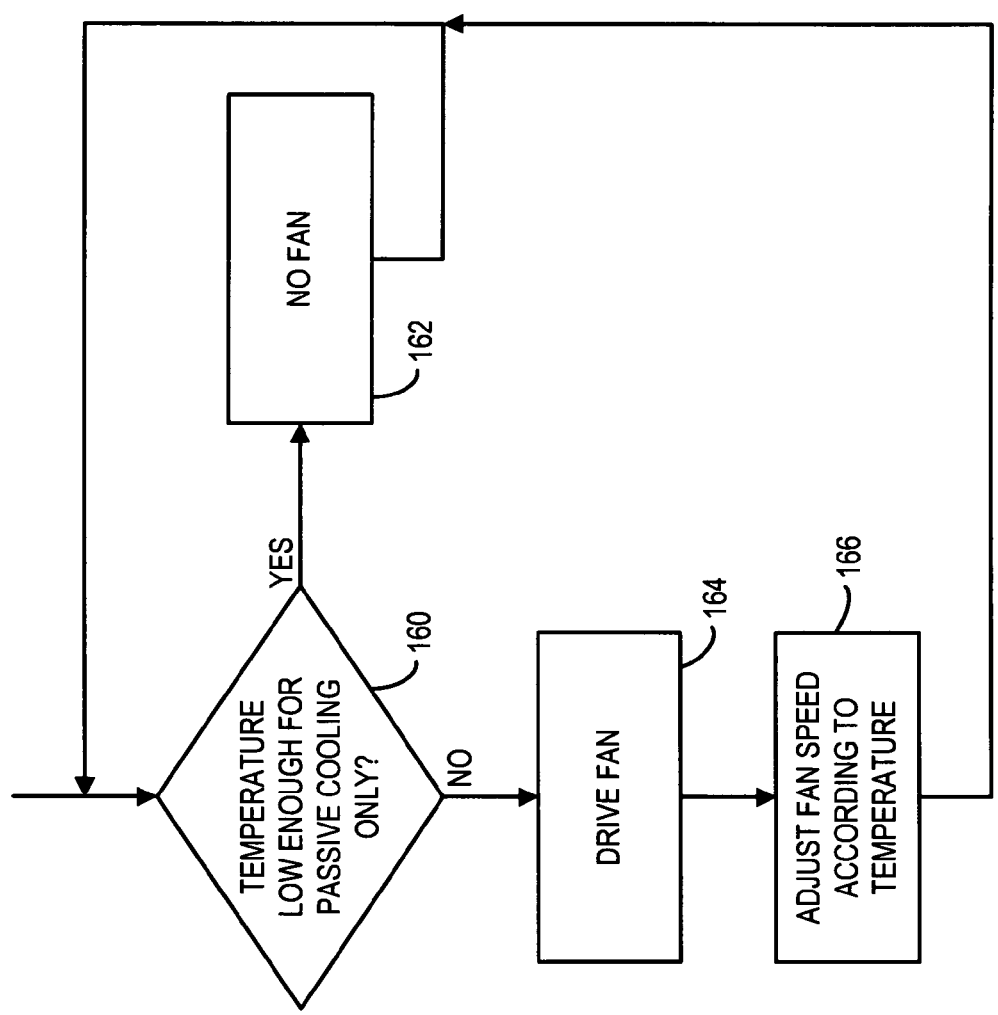
FIG. 5 is a flow chart that illustrates operation of a control circuit that is part of the fan control system of FIG. 4.

At 160 in FIG 5, a determination is made (based at least in part, e.g., on the output of the temperature sensor 152) as to whether the temperature of the microprocessor package 106 (and/or the temperature of another component of the computer system 100) is sufficiently low that active cooling by driving the fans 132 is not required. If a positive determination is made at 160 (i.e., if it is determined that the temperature is low enough to operate only with passive cooling), then the fans 132 are not driven, as is indicated at 162 in FIG 5. As a result, the microprocessor package is cooled only by passive cooling.

During passive cooling, heat is generated in the microprocessor package 106 and causes heating of the fluid in the proximal ends 120 of the heat pipes 118. The heating of the fluid may cause the fluid to undergo a phase change from a liquid state to a vapor. This phase change may serve to absorb a relatively large amount of the heat generated in the microprocessor package 106. The fluid in its vapor state may travel through the heat pipes 118 to the distal ends 122 of the heat pipes 118. The distal ends 122 of the heat pipes 118 are thermally coupled to the heat sink 110 and may be relatively cool. The fluid may condense from its vapor state to a liquid state at the distal ends 122 of the heat pipes 118, thereby releasing heat to the heat sink 110. This heat, in turn, may be radiated outside of the housing 102 by the fins 114 of the heat sink 110. The condensed fluid may be wicked back from the distal ends 122 of the heat pipes 118 to the proximal ends 120 of the heat pipes by the above-mentioned wicking structures (not separately shown) within the heat pipes.

In addition to heat transport from the microprocessor package 106 to the heat sink 110 by phase changes in the heat pipe fluid, other heat transport mechanisms may occur in the heat pipes 118, including conduction of heat by metal structures (e.g., the outer tubes) of the heat pipes 118.

Referring again to decision block 160, if a negative determination is made at that decision (i.e., if it is found that passive cooling alone was not sufficient to keep the microprocessor package temperature below a certain threshold temperature), then the control circuit 154 and the fan drive circuit 156 operate (as indicated at 164 in FIG. 5) to drive (actuate) the fans 132 to blow air between the fins 130 mounted along the parallel courses of the heat pipes 118 between the microprocessor package 106 and the heat sink 110. This may increase the amount of heat dissipated by fins 130, thereby increasing the amount of cooling provided via the heat pipes 118 to the microprocessor package 106. Moreover, in some embodiments, the fans 132 may be operable at variable speeds, and the control circuit 154 and the fan drive circuit 156 may operate to increase the fan speeds at higher microprocessor package temperatures above the minimum temperature which requires operation of the fans, and to operate the fans at relatively low speeds when the microprocessor package temperature is not much above the minimum temperature which requires operation of the fans. Thus the control circuit 154 may operate to adjust the fan speed according to the temperature of the microprocessor package, as indicated at 166. That is, the speed of rotation of the fans may be varied in dependence on an output received by the control circuit 154 from the temperature sensor 152.

It may be the case that a degree of passive cooling via transport of heat from the microprocessor package 106 to the heat sink 110 via the heat pipes 118 continues during operation of the fans 132. In addition, essentially passive cooling by radiation of heat from the fins 130 on the heat pipes 118 may occur when the fans 132 are not operating.

In any case, with the provision of the large heat sink 110, with fins extending outside of the system housing 102, and thermally coupled to the microprocessor package 106 via the heat pipes 118, it may be possible to minimize the time of operation and/or the speed of operation of the fans 132, thereby minimizing the amount of acoustic noise generated during operation of the computer system 100. Consequently, the computer system 100 may be quiet enough to serve satisfactorily as a so-called "entertainment PC".

In some embodiments there may be provided more or fewer than the two fans shown. For example, in some embodiments only one fan may be provided. In other embodiments, the fans may be eliminated entirely, and cooling of the microprocessor package 106 may be entirely passive. In some embodiments, the fins 130 may also be dispensed with.

In some embodiments, during manufacture of the cooling system 108, the fins 130 may be strung along the heat pipes 118 and the heat pipes may be bent thereafter to provide the bent shapes of the heat pipes shown in FIG. 1. In other embodiments, the heat pipes may be formed as a composite of two heat pipes spliced at their ends to form, e.g., side-by-side splices.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   an integrated circuit (IC) package;
   a heat sink having a base and a plurality of fins extending from the base;
   a plurality of heat pipes, each heat pipe having a first end and a second end, the first ends of the heat pipes thermally coupled to the IC package, the second ends of the heat pipes thermally coupled to the base of the heat sink to transfer heat from the IC package to the heat sink; and
   a second plurality of fins mounted on said heat pipes, said fins of said second plurality of fins being substantially parallel to each other and being oriented transversely relative to a length of said heat pipes;
   wherein:
       said length of said heat pipes is oriented transversely relative to said fins of said second plurality of fins;
       said length of said heat pipes passes through each of said fins of said second plurality of fins; and
       said fins of said second plurality of fins are thermally coupled to said IC package only by said heat pipes.

2. The apparatus of claim 1, further comprising:
   at least one fan positioned to selectively blow air between said fins of said second plurality of fins.

3. The apparatus of claim 2, further comprising:
   a control system to selectively actuate said at least one fan in response to an output from a temperature sensor.

4. The apparatus of claim 3, wherein said at least one fan includes two fans mounted side-by-side relative to each other.

5. The apparatus of claim 1, wherein said plurality of heat pipes includes four heat pipes.

6. The apparatus of claim 1, wherein the base of the heat sink has a length of at least 5 inches.

7. The apparatus of claim 6, wherein the base of the heat sink has a length of at least 10 inches.

8. The apparatus of claim 1, wherein the IC package comprises a microprocessor.

9. An apparatus comprising:
   a housing;
   an integrated circuit (IC) package located within the housing;
   a heat sink mounted as part of the housing and having fins that extend exteriorly from the housing, the heat sink also having a surface that is at an interior of the housing;
   a plurality of heat pipes, each having a first end thermally coupled to the IC package and a second end coupled to said surface of said heat sink;
   a second plurality of fins mounted on said heat pipes inside the housing, said fins of said second plurality of fins being substantially parallel to each other and being oriented transversely relative to a length of said heat pipes;
   a pair of fans mounted side-by-side relative to each other and positioned to selectively blow air between said fins of said second plurality of fins; and
   a control system to selectively actuate said fans in response to an output from a temperature sensor;
   wherein:
       said length of said heat pipes is oriented transversely relative to said fins of said second plurality of fins;
       said length of said heat pipes passes through each of said fins of said second plurality of fins; and
       said fins of said second plurality of fins are thermally coupled to said IC package only by said heat pipes.

10. The apparatus of claim 1, wherein each of said heat pipes comprises a hollow metal tube, a fluid in the tube and a wicking structure in the tube to wick the fluid from the second end of the heat pipe to the first end of the heat pipe.

11. The apparatus of claim 10, wherein the hollow metal tube is a hollow copper tube, and the fluid is water.

12. The apparatus of claim 1, further comprising:
   a housing which contains the IC package and the heat pipes, said fins of said heat sink being outside of said housing.

13. The apparatus of claim 12, wherein said base of said heat sink forms part of said housing.

14. The apparatus of claim 9, wherein the heat sink is formed as a unitary body.

* * * * *